United States Patent
Lee et al.

(10) Patent No.: US 10,546,623 B2
(45) Date of Patent: Jan. 28, 2020

(54) RESISTIVE MEMORY DEVICE HAVING MEMORY CELL ARRAY AND SYSTEM INCLUDING THE SAME

(71) Applicants: SAMSUNG ELECTRONICS CO., LTD., Suwon-si (KR); POSTECH ACADEMY-INDUSTRY FOUNDATION, Pohang-si (KR)

(72) Inventors: Jaeho Lee, Seoul (KR); Jaeyoon Sim, Pohang-si (KR); Kyeongjun Lee, Pohang-si (KR)

(73) Assignees: SAMSUNG ELECTRONICS CO., LTD., Suwon-si (KR); POSTECH ACADEMY-INDUSTRY FOUNDATION, Pohang-si (KR)

( * ) Notice: Subject to any disclaimer, the term of this patent is extended or adjusted under 35 U.S.C. 154(b) by 0 days.

(21) Appl. No.: 16/195,199

(22) Filed: Nov. 19, 2018

(65) Prior Publication Data

US 2019/0325933 A1    Oct. 24, 2019

(30) Foreign Application Priority Data

Apr. 19, 2018    (KR) ........................ 10-2018-0045743

(51) Int. Cl.
*G11C 11/16* (2006.01)
*G11C 11/54* (2006.01)

(52) U.S. Cl.
CPC ...... *G11C 11/1655* (2013.01); *G11C 11/1657* (2013.01); *G11C 11/1673* (2013.01); *G11C 11/1675* (2013.01); *G11C 11/54* (2013.01)

(58) Field of Classification Search
CPC ............ G11C 11/1655; G11C 11/1673; G11C 11/1675; G11C 11/1657; G11C 11/54
See application file for complete search history.

(56) References Cited

U.S. PATENT DOCUMENTS

| | | | |
|---|---|---|---|
| 6,909,628 B2 * | 6/2005 | Lin | G11C 11/16 365/158 |
| 7,173,846 B2 * | 2/2007 | Lin | G11C 11/16 365/158 |

(Continued)

FOREIGN PATENT DOCUMENTS

KR    10-2016-0132293 A    11/2016

OTHER PUBLICATIONS

S. Kim et al. "NVM Neuromorphic Core with 64k-cell (256-by-256) Phase Change Memory Synaptic Array with On-Chip Neuron Circuits for Continuous In-Situ Learning" IEEE International Electron Devices Meeting, vol. 15, 2015 (pp. 443-446).

(Continued)

*Primary Examiner* — Khamdan N. Alrobaie
(74) *Attorney, Agent, or Firm* — Sughrue Mion, PLLC

(57) ABSTRACT

A resistive memory device includes a memory cell array in which a plurality of memory cells are arranged. Each of the plurality of memory cells includes a variable resistor comprising a first end connected to a bit line, and a second end, a row transistor connected between a row source line and the second end of the variable resistor, the row transistor being selectable by a row word line, and a column transistor connected between a column source line and the second end of the variable resistor, the column transistor being selectable by a column word line. Based on the row transistor being selected, first data is written or second data is read in a row direction of the memory cell array, and based on the column transistor being selected, the first data is written or the second data is read in a column direction of the memory cell array.

20 Claims, 9 Drawing Sheets

(56) References Cited

U.S. PATENT DOCUMENTS

| | | |
|---|---|---|
| 8,918,351 B2 | 12/2014 | Arthur et al. |
| 9,165,610 B1 | 10/2015 | Poh et al. |
| 9,224,447 B2 | 12/2015 | Wang et al. |
| 2008/0165586 A1* | 7/2008 | Matsufuji .............. G11C 17/16 365/185.23 |
| 2008/0316852 A1* | 12/2008 | Matsufuji .............. G11C 17/16 365/230.06 |
| 2016/0225426 A1* | 8/2016 | Naik .................... G11C 11/165 |
| 2016/0329096 A1 | 11/2016 | Song |

OTHER PUBLICATIONS

Jae-sun Seo et al. "A 45nm CMOS Neuromorphic Chip with a Scalable Architecture for Learning in Networks of Spiking Neurons" Proceeding of Custom Integrated Circuits Conference, 2011 (4 pages total).

\* cited by examiner

RESISTIVE MEMORY DEVICE HAVING MEMORY CELL ARRAY AND SYSTEM INCLUDING THE SAME

CROSS-REFERENCE TO RELATED APPLICATION

This application claims priority from Korean Patent Application No. 10-2018-0045743, filed on Apr. 19, 2018, in the Korean Intellectual Property Office, the disclosure of which is incorporated herein by reference in its entirety.

BACKGROUND

1. Field

Apparatuses and systems consistent with embodiments relate to a resistive memory device having a memory cell array, and a system including the same.

2. Description of the Related Art

Research is being conducted on next-generation memory devices that are non-volatile and do not need to be refreshed, such as phase change RAM (PRAM), nano floating gate memory (NFGM), polymer RAM (PoRAM), magnetoresistive RAM (MRAM), etc., having high integration of dynamic random access memory (DRAM), non-volatility of flash memory, high-speed of static RAM (SRAM), etc.

In addition, studies are being conducted on neuromorphic systems that imitate a biological neural network structure using hardware to mimic the human brain. A neuromorphic system may include a synapse circuit for storing connection strengths between neurons, wherein the synapse circuit may be implemented using a memory device including variable resistors and storing one or more bits.

In order for such a neuromorphic system to perform learning using an algorithm using a bidirectional neural network structure, the memory device included in the neuromorphic system may be designed to implement a bidirectional neural network structure.

SUMMARY

According to embodiments, there is provided a resistive memory device including a memory cell array in which a plurality of memory cells are arranged in a matrix. Each of the plurality of memory cells includes a variable resistor including a first end connected to a bit line, and a second end, a row transistor connected between a row source line and the second end of the variable resistor, wherein the row transistor is selectable by a row word line, and a column transistor connected between a column source line and the second end of the variable resistor, wherein the column transistor is selectable by a column word line. Based on the row transistor being selected, first data is written or second data is read in a row direction of the memory cell array, and based on the column transistor being selected, the first data is written or the second data is read in a column direction of the memory cell array.

The resistive memory device may further include a row sense amplifier connected to the row source line, and, based on the row transistor being selected by the row word line, a logic value that may be stored in the variable resistor is identified using the row sense amplifier.

The second data may be read in the row direction of any one or any combination of first memory cells that are arranged along the row word line and connected to the row word line, among the plurality of memory cells.

The resistive memory device may further include a column sense amplifier connected to the column source line, and, based on the column transistor being selected by the column word line, a logic value that may be stored in the variable resistor is identified using the column sense amplifier.

The second data may be read in the column direction of any one or any combination of second memory cells that are arranged along the column word line and connected to the column word line, among the plurality of memory cells.

The resistive memory device may further include a write driver connected between the row source line and the bit line. Based on the row transistor being selected by the row word line, a logic value that is stored in the variable resistor may be changed or maintained, based on a voltage applied to the row source line and the bit line by the write driver.

Based on the column transistor being selected by the column word line, a logic value that may be stored in the variable resistor is changed or maintained, based on a voltage applied to the column source line and the bit line.

A first gate of the column transistor may have a first width greater than a second width of a second gate of the row transistor, and a negative voltage may be applied to either one or both of the first end and the second end of the variable resistor.

The resistive memory device may be any one or any combination of ferroelectric random access memory (FRAM), magnetoresistive random access memory (MRAM), nano-floating gate memory (NFGM), phase-change random access memory (PRAM), resistive random access memory (RRAM), static random access memory (SRAM), and flash memory.

The variable resistor may store a logic value corresponding to a bit.

According to embodiments, there is provided a system including a resistive memory device including a memory cell array in which a plurality of memory cells are arranged in a matrix, a memory controller configured to control the resistive memory device, an input/output device configured to receive first data to be written to the resistive memory device, and output second data that is read from the resistive memory device, and a processor configured to control the memory controller and the input/output device. Each of the plurality of memory cells includes a variable resistor including a first end connected to a bit line, and a second end, a row transistor connected between a row source line and the second end of the variable resistor, wherein the row transistor is selectable by a row word line, and a column transistor connected between a column source line and the second end of the variable resistor, wherein the column transistor is selectable by a column word line. Based on the row transistor being selected, the first data is written or the second is read in a row direction of the memory cell array, and, based on the column transistor being selected, the first data is written or the second data is read in a column direction of the memory cell array.

BRIEF DESCRIPTION OF THE DRAWINGS

The above and/or other aspects will become apparent and more readily appreciated from the following description of embodiments, taken in conjunction with the accompanying drawings in which.

DETAILED DESCRIPTION

Hereinafter, embodiments only for examples will be described in detail with reference to the accompanying drawings. The following description is provided for embodying the embodiments, not for limiting or restricting the scope of a right of the disclosure. Also, it will be understood that details that may be easily inferred by those of ordinary skill in the art from the detailed description of the disclosure and the embodiments belong to the scope of the right.

In the present specification, the terms "configure," "include," or the like must not be interpreted to necessarily include all of various components or operations written in the specification, and do not preclude the absence of one or more of the components or operations or the addition of other components or operations.

Also, it will be understood that, although the terms first, second, etc. may be used herein to describe various components, these components may not be limited by these terms. These terms are only used to distinguish one component from another.

The present embodiments relate to a resistive memory device including a memory cell array, and system including the same. Hereinafter, descriptions about details widely known to those of ordinary skill in the technical field to which the embodiments belong will be omitted.

In the entire specification, the term "row-direction operation" may mean a row-direction read operation and a row-direction write operation, and the term "column-direction operation" may mean a column-direction read operation and a column-direction write operation. Also, the term "row-direction read operation" may mean an operation of reading data in a row direction of a memory cell array, and the term "column-direction read operation" may mean an operation of reading data in a column direction of the memory cell array. Also, the term "row-direction write operation" may mean an operation of writing data in the row direction of the memory cell array, and the term "column-direction write operation" may mean an operation of writing data in the column direction of the memory cell array.

Figure 1:
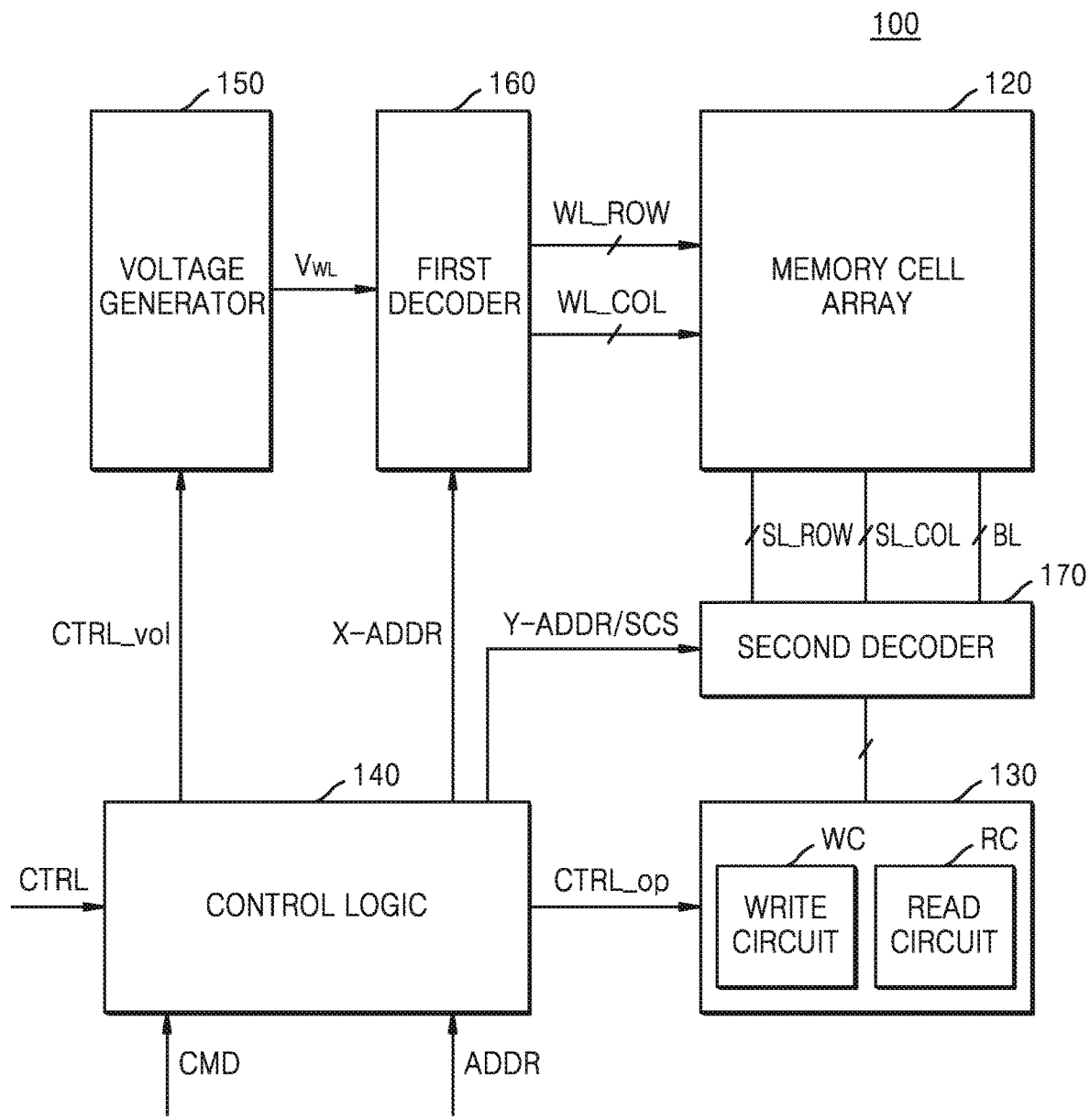
FIG. 1 is a block diagram of a configuration of a resistive memory device according to an embodiment.

FIG. 1 is a block diagram of a configuration of a resistive memory device according to an embodiment.

Referring to FIG. 1, a resistive memory device 100 may include a memory cell array 120, a read/write circuit 130, a control logic 140, a voltage generator 150, a first decoder 160, and a second decoder 170.

The memory cell array 120 may mean a structure in which a plurality of memory cells is arranged in the form of a matrix. For example, the memory cell array 120 may be configured in the form of a square matrix, although not limited thereto.

The read/write circuit 130 may include a write circuit WC and a read circuit RC. The read/write circuit 130 may perform read and write operations on the memory cell array 120, based on an operation control signal CTRL_op transmitted from the control logic 140. The read and write operations may mean an operation of reading data stored in the memory cell array 120 and an operation of writing data in the memory cell array 120.

The control logic 140 may receive signals including an address ADDR, a command CMD, and a control signal CTRL from a memory controller located outside the resistive memory device 100. The control logic 140 may control read and write operations on the memory cell array 120 based on the received signals. The control logic 140 may transmit control signals to the voltage generator 150, the first decoder 160, the second decoder 170, and the read/write circuit 130. For example, the control logic 140 may transmit an address X-ADDR to the first decoder 160, and an address Y-ADDR to the second decoder 170.

The voltage generator 150 may generate a voltage to be applied to the memory cell array 120, based on a voltage control signal CTRL_vol transmitted from the control logic 140. For example, the voltage generator 150 may generate voltages to be applied to a row word line WL_ROW and a column word line WL_COL.

The first decoder 160 may apply a word line voltage $V_{WL}$ generated by the voltage generator 150 to a row word line WL_ROW or a column word line WL_COL corresponding to the received address X-ADDR, based on the address X-ADDR transmitted from the control logic 140.

The second decoder 170 may transmit data transmitted from the write circuit WC to a row source line SL_ROW, a column source line SL_COL, and a bit line BL included in the memory cell array 120, or transmit data transmitted from the memory cell array 120 to the read circuit RC, based on the address Y-ADDR transmitted from the control logic 140.

Hereinafter, an embodiment of the resistive memory device 100 according to the disclosure will be described in detail with reference to FIGS. 2 to 11.

Figure 2:
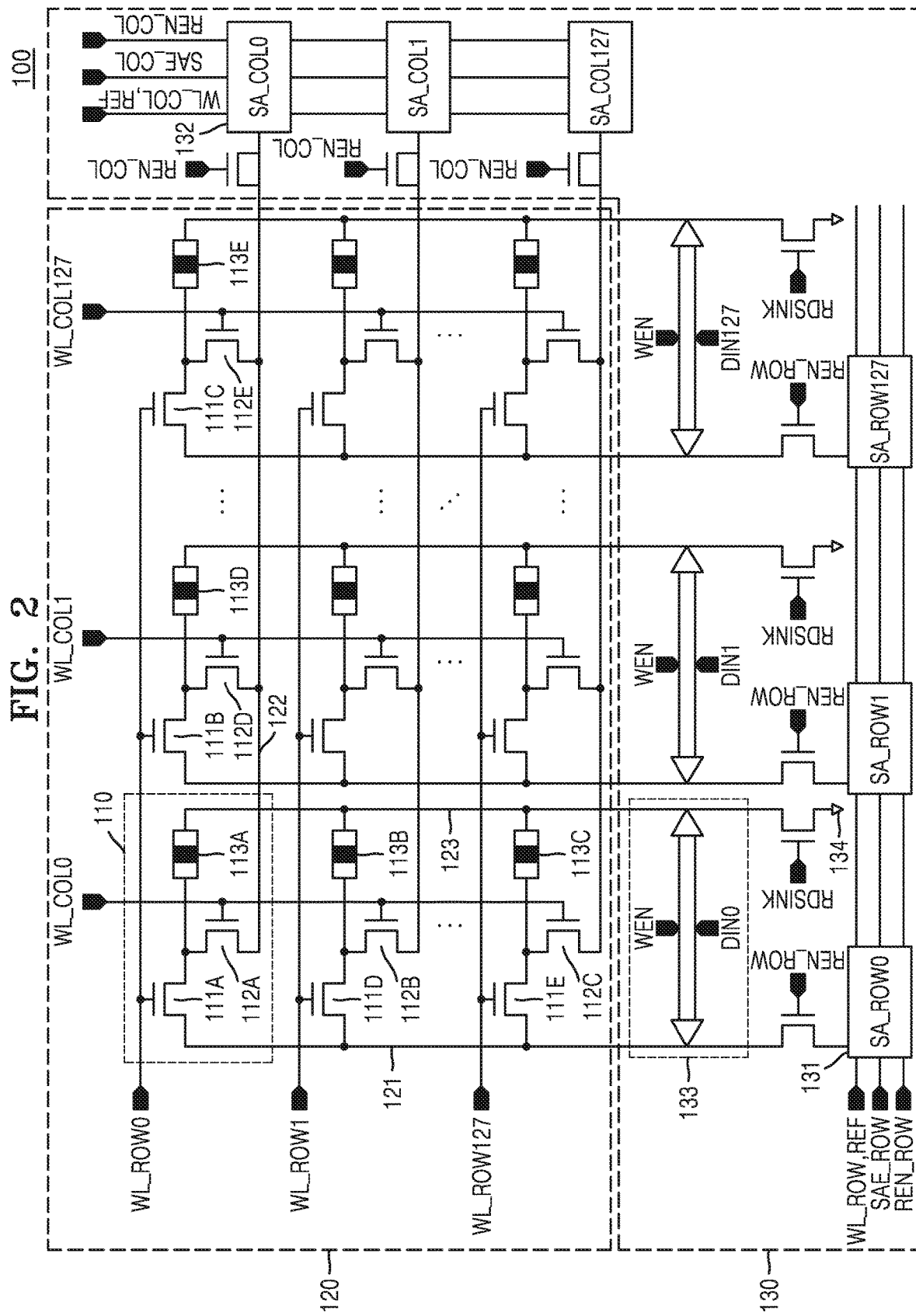
FIG. 2 is a circuit diagram of a resistive memory device according to an embodiment.

FIG. 2 is a circuit diagram of a resistive memory device according to an embodiment.

In FIG. 2, an example of the circuit diagram showing a connection relationship between components constituting the resistive memory device 100 is shown. The resistive memory device 100 may be a device of storing data using a variable resistor 113A. For convenience of description, some of the components constituting the resistive memory device 100 shown in FIG. 1 are shown in FIG. 2.

Referring to FIG. 2, the resistive memory device 100 may include the memory cell array 120 in which a plurality of memory cells including a memory cell 110 are arranged in the form of a matrix, and the read/write circuit 130 configured to control the resistive memory device 100 to perform read and write operations.

The memory cell array 120 may include the plurality of memory cells including the memory cell 110. The plurality of memory cells including the memory cell 110 may be respectively arranged at locations at which a plurality of rows intersects a plurality of columns on the memory cell array 120. The plurality of memory cells including the memory cell 110 may be connected to lines arranged in the row direction or in the column direction on the memory cell array 120.

The memory cell array 120 may include a plurality of row word lines WL_ROW0, WL_ROW1, . . . , WL_ROW127 and a plurality of column word lines WL_COL0, WL_COL1, . . . , WL_COL127. For example, the row word line WL_ROW0 may be disposed in the row direction on the memory cell array 120, and connected to a plurality of row transistors 111A, 111B, and 111C. The column word line WL_COL0 may be disposed in the column direction on the memory cell array 120, and connected to a plurality of column transistors 112A, 112B, and 112C.

The memory cell array 120 may include a plurality of row source lines including a row source line 121 and a plurality of column source lines including a column source line 122. For example, the row source line 121 may be disposed in the column direction on the memory cell array 120, and connected to a plurality of row transistors 111A, 111D, and 111E. The column source line 122 may be disposed in the row direction on the memory cell array 120, and connected to a plurality of column transistors 112A, 112D, and 112E.

Figure 11:
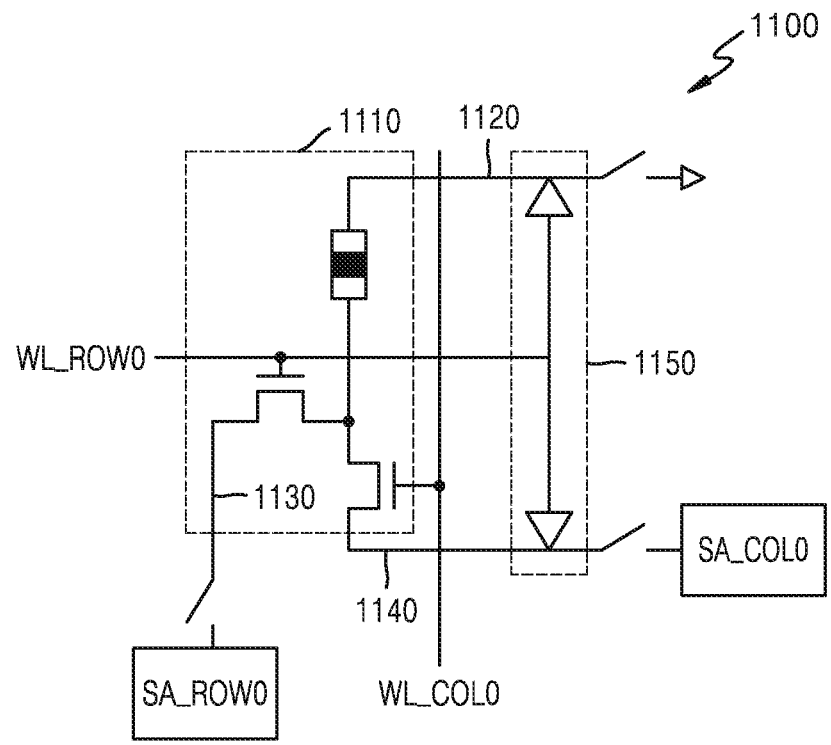
FIG. 11 is a circuit diagram of a resistive memory device according to another embodiment.

The memory cell array 120 may include a plurality of bit lines including a bit line 123. For example, the bit line 123 may be disposed in the column direction on the memory cell array 120, and connected to a plurality of variable resistors 113A, 113B, and 113C. The plurality of bit lines including the bit line 123 included in the resistive memory device 100 may be arranged in the column direction. However, the plurality of bit lines including the bit line 123 may be arranged in the row direction, as shown in FIG. 11, which will be described later.

A plurality of variable resistors 113A, 113D, and 113E included in a plurality of memory cells connected to the row word line WL_ROW0 may be connected to different bit lines, whereas a plurality of memory cells selected by the column word line WL_COL0 may share the same bit line 123. For example, all of the plurality of variable resistors 113A, 113B, and 113C included in the memory cells selected by the column word line WL_COL0 may be connected to the same bit line 123.

Because the memory cells selected by the column word line WL_COL0 share the same bit line 123, a difference may be made between column-direction read and write operations and row-direction read and write operations. The difference between the column-direction read and write operations and the row-direction read and write operations will be described in detail with reference to FIGS. 6 and 9, later.

The memory cell array 120 may be in the form of a 128×128 matrix including 128 rows and 128 columns. The memory cell array 120 may include 16384 memory cells, 128 row word lines, 128 column word lines, 128 row source lines, 128 column source lines, 128 bit lines, 128 row sense amplifiers, 128 column sense amplifiers, and 128 write drivers. However, the 128×128 matrix form of the memory cell array 120 is only an example, and the memory cell array 120 may be configured with an arbitrary positive integer number of rows and an arbitrary integer number of columns.

The prefixes "row" and "column" used in the disclosure may be provided to distinguish a row-direction operation from a column-direction operation. The prefixes "row" and "column" are used for convenience of description, not for limitation. For example, when the resistive memory device 100 is rotated by 90 degrees in a clockwise or counterclockwise direction, the row direction and the column direction may be exchanged.

Each memory cell may have a 2T-1 R (2 transistors-1 resistor) structure including two transistors and a variable resistor. For example, the memory cell 110 may include the row transistor 111A, the column transistor 112A, and the variable resistor 113A. The row transistor 111A may be connected to the variable resistor 113A, and the column transistor 112A may be connected to a node at which the variable resistor 113A is connected to the row transistor 111A.

The row transistor 111A may be connected to the row word line WL_ROW0 through the gate terminal. The row transistor 111A may connect the drain terminal to the source terminal according to a voltage applied to the row word line WL_ROW0.

The row transistor 111A may be connected between the row source line 121 and the variable resistor 113A. Any one of the source terminal and the drain terminal of the row transistor 111A may be connected to the row source line 121, and the other one may be connected to the variable resistor 113A. For example, when the row transistor 111A is a N-type Metal Oxide Semiconductor (NMOS) transistor, the drain terminal of the row transistor 111A may be connected to the row source line 121, and the source terminal of the row transistor 111A may be connected to the variable resistor 113A.

The plurality of row transistors 111A, 111B, and 111C may be arranged along the same row on the memory cell array 120, and connected to the row word line WL_ROW0. When VDD is applied to the row word line WL_ROW0, all of the plurality of row transistors 111A, 111B, and 111C may be shorted.

The plurality of row transistors 111A, 111D, and 111E may be arranged along the same column on the memory cell array 120, and connected to the row source line 121. The row source line 121 may be connected to a row sense amplifier 131 (SA_ROW) included in the read/write circuit 130. When VDD is applied to the row word line WL_ROW0, the row transistor 111A may be shorted, and the row sense amplifier 131 may be connected to the variable resistor 113A through the row source line 121.

The column transistor 112A may be connected to the column word line WL_COL0 through the gate terminal. The column transistor 112A may connect the drain terminal to the source terminal according to a voltage applied to the column word line WL_COL0.

The column transistor 112A may be connected between the column source line 122 and the variable resistor 113A. Any one of the source terminal and the drain terminal of the column transistor 112A may be connected to the column source line 122, and the other one may be connected to the variable resistor 113A. For example, when the column transistor 112A is a NMOS transistor as shown in FIG. 2, the source terminal of the column transistor 112A may be connected to the variable resistor 113A, and the drain terminal of the column transistor 112A may be connected to the column source line 122. However, this is only an example, and the column transistor 112A may be a P-type Metal Oxide Semiconductor (PMOS) transistor. When the column transistor 112A is a PMOS transistor, the source terminal and the drain terminal of the column transistor 112A may be connected in the opposite direction to when the column transistor 112A is a NMOS transistor.

The plurality of column transistors 112A, 112B, and 112C may be arranged along the same column on the memory cell array 120, and connected to the column word line WL_COL0. When VDD is applied to the column word line WL_COL0, all of the plurality of row transistors 112A, 112B, and 112C may be shorted.

The plurality of column transistors 112A, 112D, and 112E may be arranged along the same row on the memory cell array 120, and connected to the column source line 122. The column source line 122 may be connected to a column sense amplifier 132 (SA_COL) included in the read/write circuit 130. When VDD is applied to the column word line WL_COL0, the column transistor 112A may be shorted, and the column sense amplifier 132 may be connected to the variable resistor 113A through the column source line 122.

The variable resistor 113A may have any one of a predetermined number of resistance values. For example, the variable resistor 113A used in the resistive memory device 100 may store 1 bit. The variable resistor 113A may have $2^1$ resistance values, wherein each resistance value corresponds to a logic value 1 (TRUE) or 0 (FALSE). However, a variable resistor storing a plurality of bits may be used. For example, the resistive memory device 100 may include a variable resistor storing 2 bits. The variable resistor storing 2 bits may have $2^2$ resistance values, and the $2^2$ resistance values may correspond to $2^2$ data.

The variable resistor 113A may be a Magnetic Tunnel Junction (MTJ) device. The MTJ device may be configured with ferroelectrics of a pinned layer, ferroelectrics of a free layer, and an insulator disposed therebetween. When a magnetization direction of the free layer is identical to that of the pinned layer, the MTJ device may have a low resistance value, and when the magnetization direction of the free layer is different from that of the pinned layer, the MTJ device may have a high resistance value. Two resistance values that the MTJ device may have may correspond to logic values 0 and 1, respectively, and an operation of reading a logic value stored in the MTJ device may be performed. When a current of a predetermined level or higher is supplied to the MTJ device, the magnetization direction of the free layer may change according to a direction of the supplied current. When the magnetization direction of the free layer changes, an operation of writing a logic value in the MTJ device may be performed.

The read/write circuit 130 may be used for reading data stored in the memory cell array 120 or writing data in the memory cell array 120. The read/write circuit 130 may be connected to the plurality of row source lines including the row source line 121, the plurality of column source lines including the column source line 122, and the plurality of bit lines including the bit line 123.

When an operation of reading a logic value stored in the variable resistor 113A is performed, the row sense amplifier 131 and the column sense amplifier 132 may measure a resistance value of the variable resistor 113, which changes according to the stored logic value, and amplify a change in voltage of an output terminal (OUT of FIG. 4) to output a logic value of 0 or 1.

The read/write circuit 130 may include a plurality of row sense amplifiers including the row sense amplifier 131. The row sense amplifier 131 may be used to perform an operation of measuring a resistance value of any one of the plurality of variable resistors 113A, 113B, and 113C arranged in the column direction to identify a logic value corresponding to the measured resistance value. The plurality of row sense amplifiers including the row sense amplifier 131 may be disposed to correspond to the plurality of columns of the memory cell array 120. With respect to each of the plurality of columns of the memory cell array 120, the row sense amplifier 131 may be connected to the row source line 121. When a reference row word line signal WL_ROW, REF, a row sense amplifier enable signal SAE_ROW, and a row read enable signal REN_ROW are applied to the row sense amplifier 131, a row-direction read operation may be performed. The row-direction read operation will be described in detail with reference to FIG. 3, later.

The read/write circuit 130 may include a plurality of column sense amplifiers including the column sense amplifier 132. The column sense amplifier 132 may be used to perform an operation of measuring a resistance value of any one of the plurality of variable resistors 113A, 113D, and 113E arranged in the row direction to identify a logic value corresponding to the measured resistance value. The plurality of column sense amplifiers including the column sense amplifier 132 may be disposed to correspond to the plurality of rows of the memory cell array 120. With respect to each of the plurality of rows of the memory cell array 120, the column sense amplifier 132 may be connected to the column source line 122. When a reference column word line signal WL_COL,REF, a column sense amplifier enable signal SAE_COL, and a column read enable signal REN_COL are applied to the column sense amplifier 132, a column-direction read operation may be performed. The column-direction read operation will be described in detail with reference to FIG. 6, later.

The read/write circuit 130 may include a plurality of write drivers including a write driver 133. The write driver 133 may be used to perform an operation of applying a voltage to both ends of any one of the plurality of variable resistors 113A, 113B, and 113C arranged in the column direction to write a logic value in any one of the plurality of variable resistors 113A, 113B, and 113C. The plurality of write drivers including the write driver 133 may be disposed to correspond to the plurality of columns of the memory cell array 120. With respect to each of the plurality of columns of the memory cell array 120, the write driver 133 may be connected to the row source line 121 and the bit line 123. The write driver 133 may be used to perform a row-direction write operation, and not used to perform a column-direction write operation. The write driver 133 and the row-direction write operation will be described in detail with reference to FIGS. 7 and 8, later. Also, the column-direction write operation will be described in detail with reference to FIG. 9, later.

According to the 2T-1 R structure of the memory cell 110, access to the variable resistor 113A may be possible through any one of the row transistor 111A selected by the row word line WL_ROW0 and the column transistor 112A selected by the column word line WL_COL0. Because read and write operations on a logic value that is stored in the variable resistor 113A may be performed bi-directionally, read and write operations may be transposed. That is, the resistive memory device 100 according to the disclosure may perform transposable read and write operations.

Because read and write operations may be transposed, it may be possible to reduce a time and power that is consumed when read and write operations on data stored in the resistive memory device 100 are performed. For example, when logic values stored in the three variable resistors 113A, 113B, and 113C are read, a row-direction read operation may be performed three times using the row transistors 111A, 111D, and 111E selected by the row word lines WL_ROW0, WL_ROW1, and WL_ROW127. However, a column-direction read operation may be performed one time using the column transistors 112A, 112B, and 112C selected by the column word line WL_COL0.

Accordingly, by combining row-direction operations and column-direction operations appropriately based on an arrangement distribution of the memory cells to be subject to reading and writing on the memory cell array 120, it may be possible to minimize access to unnecessary data, and to reduce a time and power consumed for reading and writing. For example, a plurality of row-direction operations and a plurality of column-direction operations may be combined in such a way to minimize a total number of times the row-direction operations and the column-direction operations are performed.

The resistive memory device 100 may be Magnetoresistive Random Access Memory (MRAM) in which the variable resistor 113A included in the memory cell 110 is a MTJ device. However, the resistive memory device 100 is not limited to MRAM, and the resistive memory device 100 may be any one of ferroelectric random access memory (FRAM), nano-floating gate memory (NFGM), phase-change random access memory (PRAM), resistive random access memory (RRAM), static random access memory (SRAM), and flash memory. For example, when ferroelectrics is used as the variable resistor 113A, the resistive memory device 100 may be FRAM. As another example, when a phase change material whose resistance changes according to temperature is used as the variable resistor 113A, the resistive memory device 100 may be PRAM.

Hereinafter, a row-direction read operation that is performed by the resistive memory device 100 according to the disclosure will be described in detail with reference to FIGS. 3 to 5.

Figure 3:
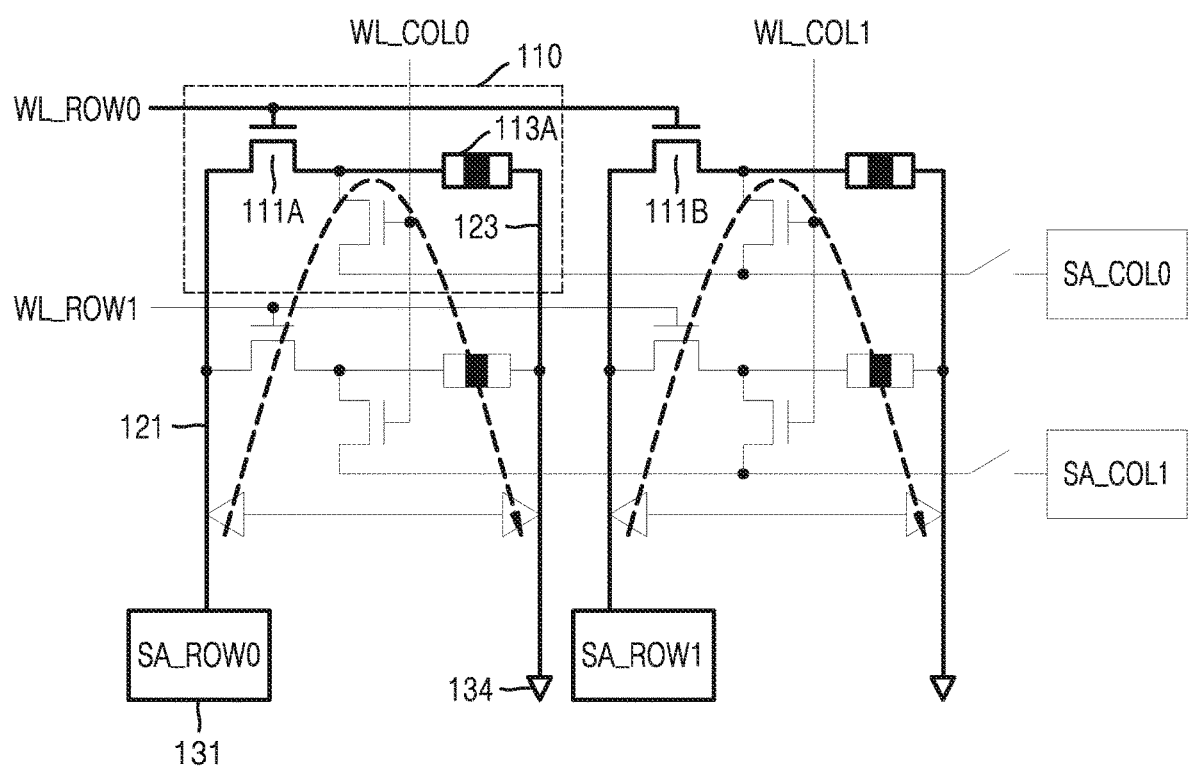
FIG. 3 is a diagram of a partial configuration of a resistive memory device for describing an operation of reading data in a row direction, according to an embodiment.

FIG. 3 is a diagram of a partial configuration of a resistive memory device for describing an operation of reading data in the row direction, according to an embodiment.

Referring to FIG. 3, when VDD is applied to the row word line WL_ROW0, the row transistor 111A may be shorted to form a path connecting the row sense amplifier 131, the row source line 121, the variable resistor 113A, the bit line 123, and a ground 134. As shown in FIG. 3, read current may flow from the row sense amplifier 131 to the ground 134 in the direction of an arrow. An intensity of the read current may change according to a resistance value corresponding to a logic value stored in the variable resistor 113A. The row sense amplifier 131 may amplify a voltage of the output terminal (OUT of FIG. 4) to 0 or VDD according to the intensity of the read current. A detailed configuration of the row sense amplifier 131 is shown in FIG. 4.

The above descriptions about a read operation on the memory cell 110 may be applied in the same manner to a memory cell including another row transistor 111B selected by the row word line WL_ROW0.

Figure 4:
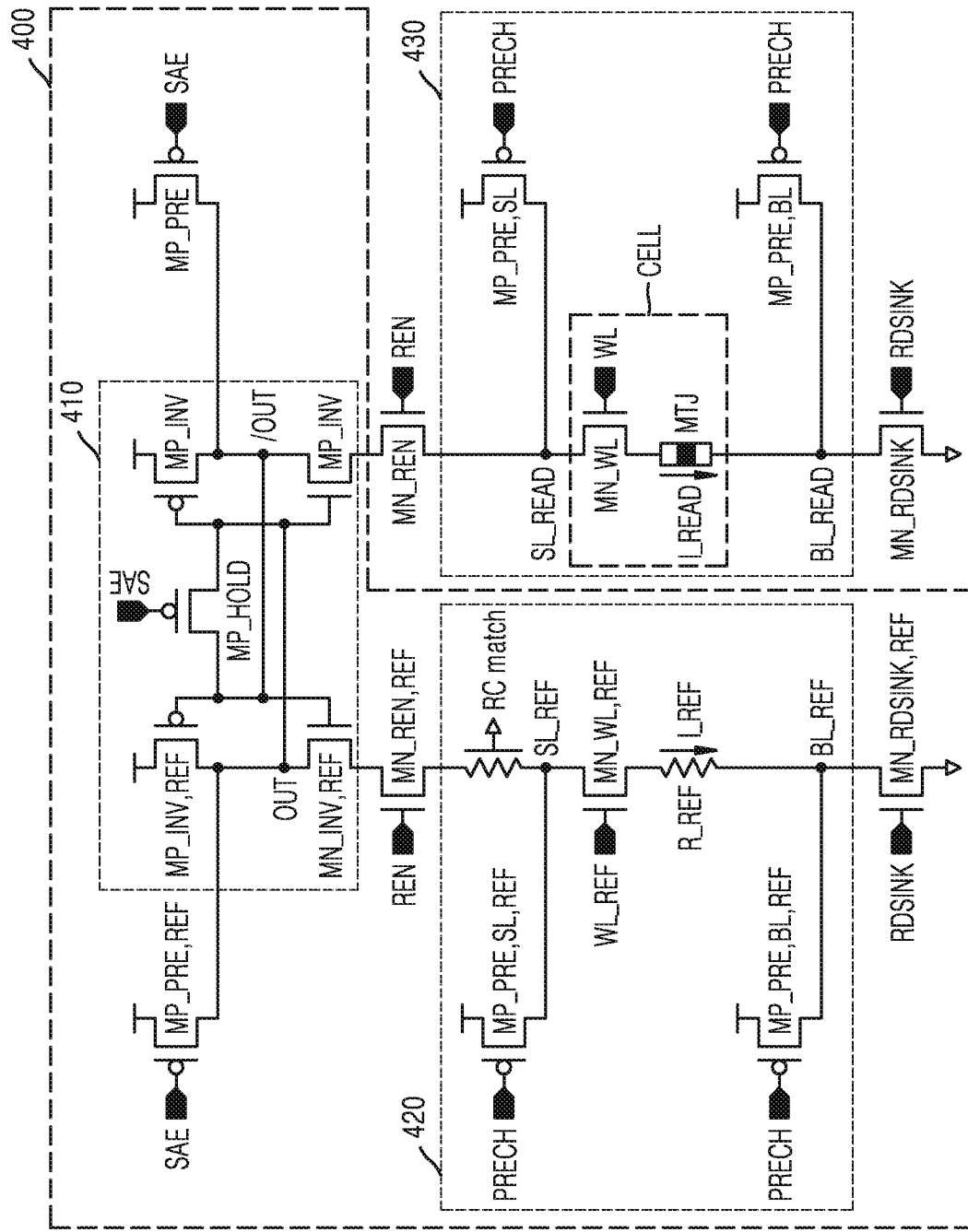
FIG. 4 is a structural diagram of a sense amplifier according to an embodiment.

FIG. 4 is a structural diagram of a sense amplifier according to an embodiment.

In FIG. 4, a sense amplifier 400 including a cross-coupled inverter 410 and a reference device 420 is shown. The cross-coupled inverter 410 may be connected to the reference device 320 through which reference current I_REF flows, and a memory cell 430 through which reading current I_READ flows. Comparing to the resistive memory device 100 shown in FIG. 2, the sense amplifier 400 may correspond to the row sense amplifier 131, the memory cell 430 may correspond to the memory cell 110, the word line transistor MN_WL may correspond to the row transistor 111A, the MTJ device may correspond to the variable resistor 113A, the read source line SL_READ may correspond to the row source line 121, and the read bit line BL_READ may correspond to the bit line 123.

When a read operation is performed using the sense amplifier 400, a sense amplifier enable signal SAE for activating the cross-coupled inverter 410, a pre-charge signal PRECH for applying VDD in advance to nodes of the memory cell 430 and the reference device 420, a read enable signal REN for connecting the reference device 420 and the memory cell 430 to the cross-coupled inverter 410, a read ground signal RDSINK for connecting the reference device 420 and the memory cell 430 to the ground, and word line signals WL and WL_REF for enabling the reading current I_READ and the reference current I_REF to flow may be used. Hereinafter, a read operation will be described in detail with reference to FIG. 5.

Figure 5:
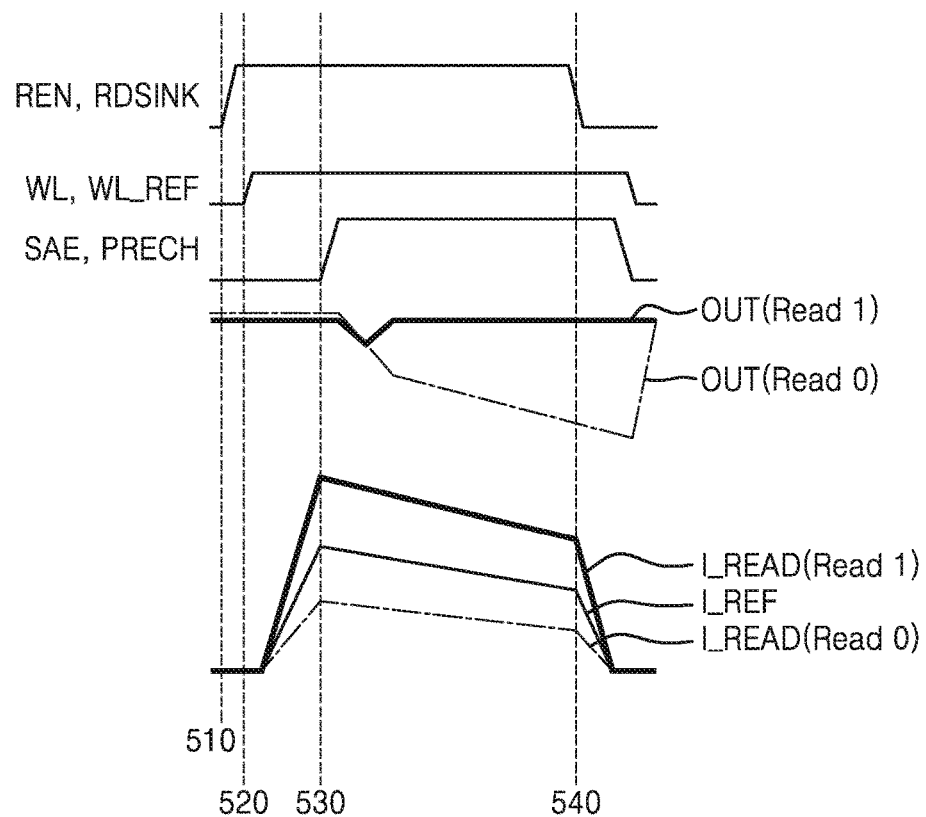
FIG. 5 is a diagram of operation waveforms of a sense amplifier, according to an embodiment.

FIG. 5 is a diagram of operation waveforms of a sense amplifier according to an embodiment.

Referring to FIGS. 4 and 5, at a time 510, VDD may be applied to the read enable signal REN and the read ground signal RDSINK, and accordingly, the reference device 420 and the memory cell 430 may be connected to the cross-coupled inverter 410 and the ground to form a path along which current may flow through the reference device 420 and the memory cell 430.

At a time 520, VDD/2 may be applied to the word line signal WL and the reference word line signal WL_REF, and accordingly, the word line transistor MN_WL and the reference word line transistor MN_WL,REF may be shorted. A reason why VDD/2, instead of VDD, is applied to the word line signal WL and the reference word line signal WL_REF in a read operation will be described in detail with reference to FIG. 10, later.

Until the time 520, 0 may be applied to the sense amplifier enable signal SAE, and VDD may be applied to the output terminal OUT and an inverting output terminal/OUT through PMOS transistors MP_PRE, MP_PRE,REF, and MP_HOLD.

Until the time 520, as 0 is applied to the pre-charge signal PRECH, VDD may be applied to the source lines SL_READ and SL_REF and the bit lines BL_READ and BL_REF through the PMOS transistors MP_PRE,SL, MP_PRE,SL, REF, MP_PRE,BL, and MP_PRE,BL,REF.

During a time period between the time 520 and a time 530, a voltage may be applied to both ends of a reference resistor R_REF and the MTJ device, and accordingly, reference current I_REF may flow through the reference device 420, and read current I_READ may flow through the memory cell 430. When a logic value 0 has been stored in the MTJ device, an intensity of the read current I_READ may be smaller than that of the reference current I_REF because a resistance value of the MTJ device is high, and when a logic value 1 has been stored in the MTJ device, the intensity of the read current I_READ may be greater than that of the reference current I_REF because the resistance value of the MTJ device is low.

At the time 530, VDD may be applied to the sense amplifier enable signal SAE, and accordingly, the cross-coupled inverter 410 may be activated. Also, VDD may be applied to the pre-charge signal PRECH, and accordingly, a voltage applied to the source lines SL_READ and SL_REF and the bit lines BL_READ and BL_REF may change from VDD to 0. Because a voltage applied to both ends of the variable resistor (MTJ device) and the reference resistor R_REF becomes 0, the intensities of the read current I_READ and the reference current I_REF may be reduced.

When a logic value 1 has been stored in the MTJ device, the intensity of the read current I_READ may be greater than that of the reference current I_REF because the resistance value of the MTJ device is low. Charges of the inverting output terminal /OUT connected to the memory cell 430 along which the read current I_READ flows may be reduced faster than those of the output terminal OUT connected to the reference device 420 along which the reference current I_REF flows. Accordingly, a voltage of the inverting output terminal /OUT may converge into 0, and a voltage of the output terminal OUT may converge into VDD, so that the logic value 1 stored in the MTJ device may be read.

When a logic value 0 has been stored in the MTJ device, the intensity of the read current I_READ may be smaller than that of the reference current I_REF because the resistance value of the MTJ device is high. Therefore, the charges of the inverting output terminal /OUT connected to the memory cell 430 along which the read current I_READ flows may be reduced slower than those of the output terminal OUT connected to the reference device 420 along which the reference current I_REF flows. Accordingly, the voltage of the inverting output terminal /OUT may converge into VDD, and the voltage of the output terminal OUT may converge into 0, so that the logic value 0 stored in the MTJ device may be read.

At a time 540, 0 may be applied to the read enable signal REN and the read ground signal RDSINK, and accordingly, the reference device 420 and the memory cell 430 may be separated from the cross-coupled inverter 410 and the ground, and the intensities of the read current I_READ and the reference current I_REF may become 0.

As the row source line 121 connected to the row sense amplifier 131 is connected to a plurality of memory cells as shown in FIG. 2, the sense amplifier 400 shown in FIG. 4 may be connected to a plurality of memory cells. However, in FIG. 4, a single memory cell 430 is shown for convenience of description. To remove impedance asymmetry generated between the reference device 32 and the plurality of memory cells connected in parallel and including the memory cell 430, RC matching may be applied to the reference device 430.

As shown in FIG. 2, the row sense amplifier enable signal SAE_ROW and the row read enable signal REN_ROW may be applied to all of the plurality of row sense amplifiers including the row sense amplifier 131 on the read/write circuit 130, however, the row sense amplifier enable signal SAE_ROW and the row read enable signal REN_ROW may be applied to the plurality of row sense amplifiers including the row sense amplifier 131, individually. Accordingly, a row-direction read operation may be performed on all or a part of memory cells selected by an arbitrary row word line.

Hereinafter, a column-direction read operation that is performed by the resistive memory device 100 according to the disclosure will be described in detail with reference to FIG. 6.

Figure 6:
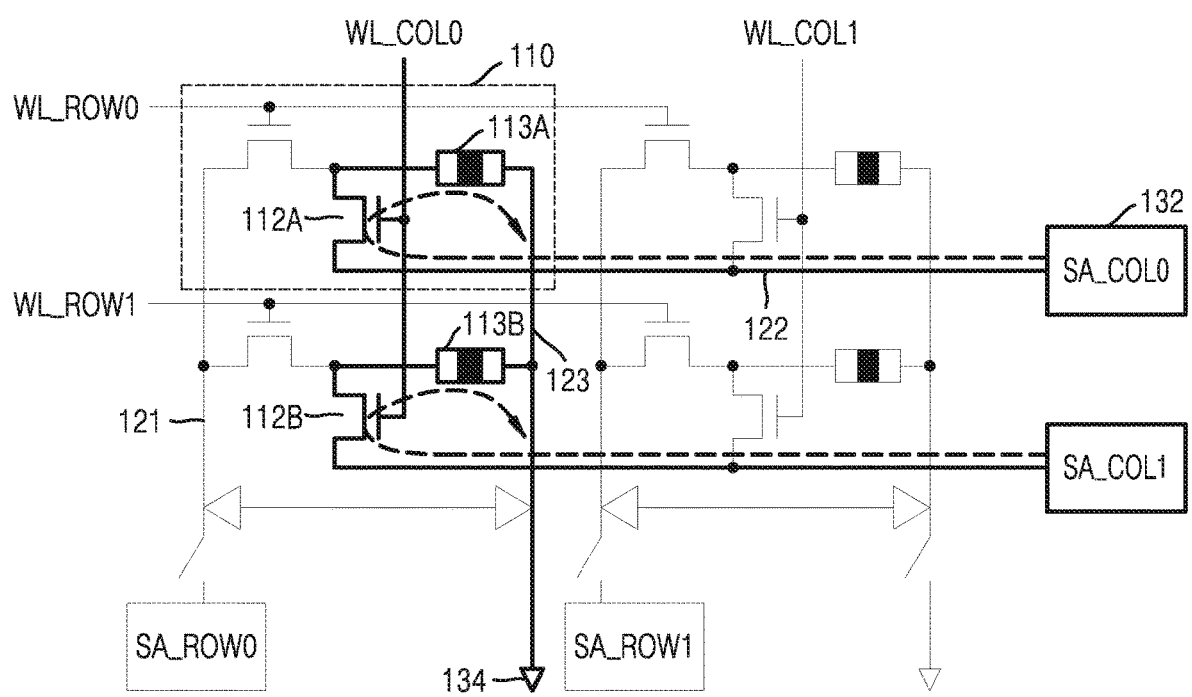
FIG. 6 is a diagram of a partial configuration of a resistive memory device for describing an operation of reading data in a column direction, according to an embodiment.

FIG. 6 is a diagram of a partial configuration of a resistive memory device for describing an operation of reading data in the column direction, according to an embodiment.

A column-direction read operation may be performed in the same manner as a row-direction read operation. Referring to FIG. 6, a read operation may be performed on a plurality of memory cells selected by the column word line WL_COL0 and including the memory cell 110. The column transistor 112A, instead of the row transistor 111A, may be selected by the column word line WL_COL0, and the column source line 122, instead of the row source line 121, may be connected to the variable resistor 113A through the column transistor 112A. A read operation of identifying a logic value stored in the variable resistor 113A may be performed by the column sense amplifier 132, instead of the row sense amplifier 131.

As described above, because the plurality of bit lines including the bit line 123 are arranged in the column direction on the memory cell array 120, a difference between a row-direction read operation and a column-direction read operation may be made. Comparing FIG. 3 to FIG. 6, a plurality of read currents involved by a row-direction read operation may flow to a plurality of grounds including the ground 134 through the plurality of bit lines including the bit line 123 as shown in FIG. 3, whereas a plurality of read currents involved by a column-direction read operation may flow to the ground 134 through the same bit line 123 as shown in FIG. 6. Accordingly, an intensity of current flowing through the bit line 123 when a column-direction read operation is performed may be greater than that when a row-direction read operation is performed.

When a great intensity of current flows through the bit line 123, like the case in which a column-direction read operation is performed, an influence of a voltage drop on the bit line 123 may not be negligible. In the case of a row-direction read operation, a voltage drop on the bit line 123 may need not to be considered, however, in the case of a column-direction read operation, a voltage drop may need to be considered. The reason is because as a voltage drop on the bit line 123 increases, an intensity of a voltage applied to both ends of the variable resistor 113A during a read operation decreases.

As the voltage applied to both ends of the variable resistor 113A decreases, an intensity of the read current I_READ may decrease. Accordingly, it may be difficult to compare the intensity of the read current I_READ to that of the reference current I_REF.

Accordingly, to decrease a voltage drop on the plurality of bit lines including the bit line 123 and prevent an intensity of a voltage applied to both ends of the variable resistor 113A from decreasing when a read operation is performed, the plurality of bit lines including the bit line 123 may be designed to have a low resistance value. For example, the bit line 123 may be formed with a material having a low resistance value, or designed to have a larger width than the other lines such as the row word line WL_ROW0.

Hereinafter, referring to FIGS. 7 and 8, a row-direction write operation that is performed by the resistive memory device 100 according to the disclosure will be described in detail.

Figure 7:
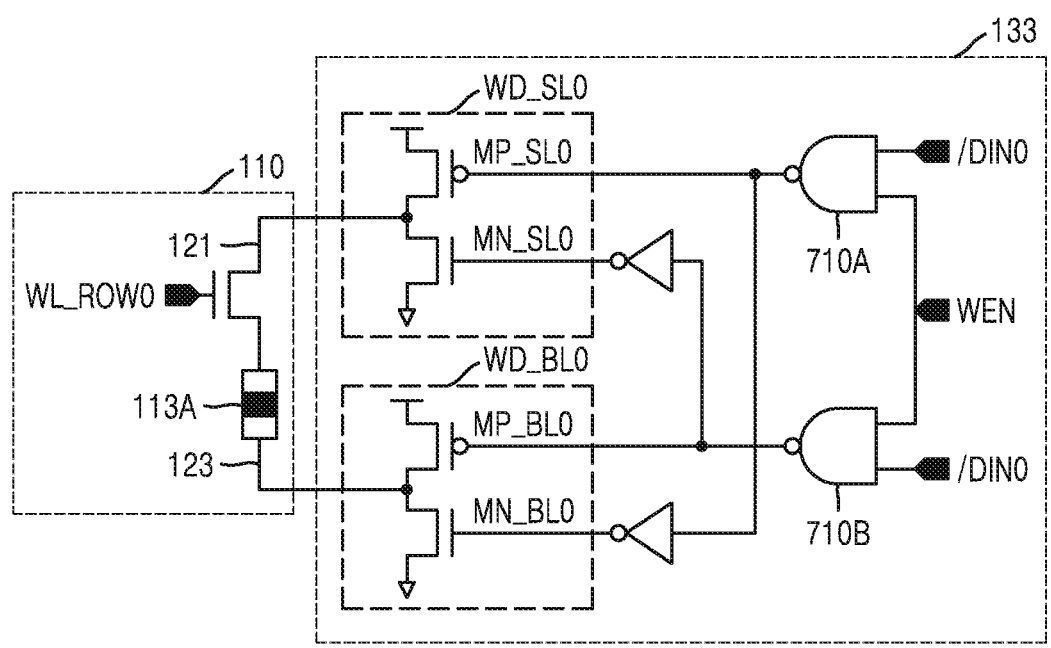
FIG. 7 shows a diagram of a structure of a write driver according to an embodiment and a table for describing operations of the write driver.

FIG. 7 a diagram of a structure of a write driver according to an embodiment and a table for describing operations of the write driver.

Referring to FIG. 7, the write driver 133 connected to the memory cell 110 through the row source line 121 and the bit line 123 is shown. The write driver 133 may include a source line write driver WD_SL0 for applying a voltage to the row source line 121, and a bit line write driver WD_BL0 for applying a voltage to the bit line 123. The write driver 133 may receive signals including a write enable signal WEN, input data DIN0, and inverting input data /DIN0, and perform an operation of writing data in the memory cell 110 based on the received signals.

Referring to an operation No Write of a table 720, when 0 is applied to the write enable signal WEN, outputs of two NAND gates 710A and 710B may become VDD. Then, VDD may be applied to the gates of PMOS transistors MP_SL0 and MP_BL0, and 0 may be applied to the gates of NMOS transistors MN_SL0 and MN_BL0 by inverters. The PMOS transistors MP_SL0 and MP_BL0 and the NMOS transistors MN_SL0 and MN_BL0 may operate as open switches, and no voltage by the write driver 133 may be applied to the row source line 121 and the bit line 123.

Referring to an operation Write "0" of the table 720, when VDD is applied to the write enable signal WEN and 0 is applied to the input data DIN0, an output of the NAND gate 710A may become 0, and an output of the NAND gate 710B may become VDD. Then, VDD may be applied to the row source line 121 by the PMOS transistor MP_SL0, and 0 may be applied to the bit line 123 by the NMOS transistor MN_BL0. Accordingly, a logic value 0 may be written in the variable resistor 113A by the voltage applied to the row source line 121 and the bit line 123.

Referring to an operation Write "1" of the table 720, when VDD is applied to the write enable signal WEN and the input data DIN0, an output of the NAND gate 710A may become VDD, and an output of the NAND gate 710B may become 0. Then, 0 may be applied to the row source line 121 by the NMOS transistor MN_SL0, and VDD may be applied to the bit line 123 by the PMOS transistor MP_BL0. Accordingly, a logic value 1 may be written in the variable resistor 113A by the voltages applied to the row source line 121 and the bit line 123.

Figure 8:
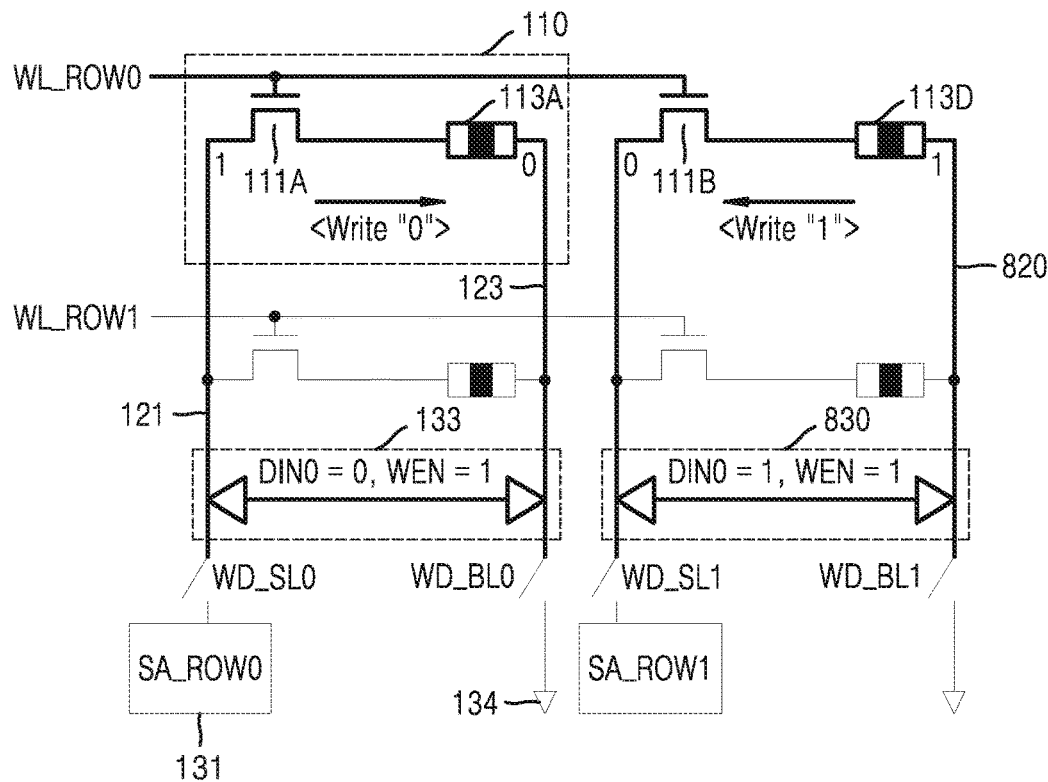
FIG. 8 is a diagram of a partial configuration of a resistive memory device for describing an operation of writing data in a row direction, according to an embodiment.

FIG. 8 is a diagram of a partial configuration of a resistive memory device for describing an operation of writing data in the row direction, according to an embodiment.

Referring to FIG. 8, an operation of writing a logic value 0 or 1 in the variable resistor 113A using the write driver 133 described above with reference to FIG. 7 will be described. The operation may include an operation of changing or maintaining logic values stored in the variable resistor 113A.

When a logic value 0 is written in the variable resistor 113A, the row transistor 111A may be shorted by the row word line WL_ROW0, and both ends of the variable resistor 113A may be connected to the write driver 133 through the row source line 121 and the bit line 123. When VDD is applied to the write enable signal WEN and 0 is applied to the input data DIN0, VDD may be applied to the row source line 121, and 0 may be applied to the bit line 123. When VDD is applied to both ends of the variable resistor 113A, write current may flow from the row source line 121 to the bit line 123. Due to the write current, magnetization directions of the pinned layer and the free layer of the variable resistor 113A that is a MTJ device may be opposite to each other, so that the MTJ device may have a high resistance value. Because the variable resistor 113A having the high resistance value corresponds to a logic value 0, the operation of writing the logic value 0 may be completed.

When a logic value 1 is written in the variable resistor 113A, the row transistor 111B may be shorted by the row word line WL_ROW0, and both ends of the variable resistor 113A may be connected to a write driver 830 through a row source line 810 and a bit line 820. When VDD is applied to the write enable signal WEN and 1 is applied to the input data DIN1, 0 may be applied to the row source line 810, and VDD may be applied to the bit line 820. When VDD is applied to both ends of the variable resistor 113D, write current may flow from the bit line 820 to the row source line 810. Due to the write current, magnetization directions of the pinned layer and the free layer of the variable resistor 113D that is a MTJ device may be identical to each other, so that the MTJ device may have a low resistance value. Because the variable resistor 113D having the low resistance value corresponds to a logic value 1, the operation of writing the logic value 1 may be completed.

As shown in FIG. 2, the write enable signal WEN is applied to all of a plurality of write drivers including the write driver 133 on the read/write circuit 130, however, the write enable signal WEN may be applied to the plurality of write drivers including the write driver 133, individually. Accordingly, a row-direction write operation may be performed on all or a part of memory cells selected by an arbitrary row word line.

Hereinafter, a column-direction write operation that is performed by the resistive memory device 100 according to the disclosure will be described in detail.

Figure 9:
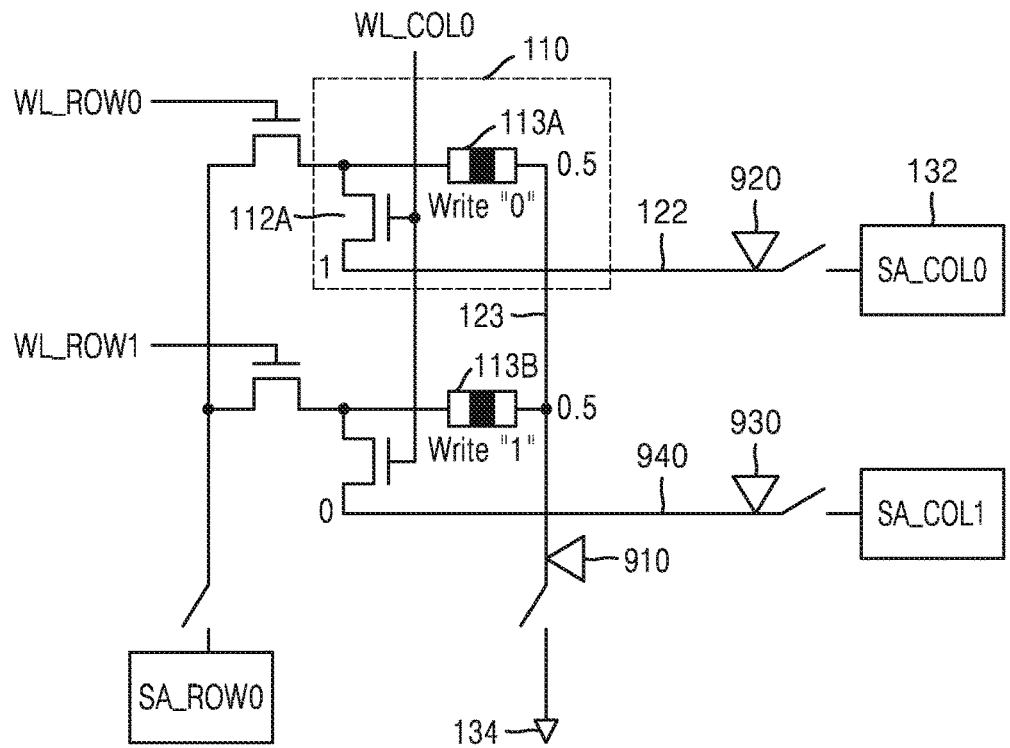
FIG. 9 is a diagram a partial configuration of a resistive memory device for describing an operation of writing data in a column direction, according to an embodiment.

FIG. 9 is a diagram of a partial configuration of a resistive memory device for describing an operation of writing data in a column direction, according to an embodiment.

Referring to FIG. 9, when the column transistor 112A selected by the column word line WL_COL0 is shorted, the variable resistor 113A may be connected between the column source line 122 and the bit line 123. A column-direction write operation may be performed in the same manner as a row-direction write operation except that voltages applied to both ends of the variable resistor 113A are not provided by a write driver.

In a row-direction write operation, voltages may be respectively applied to both ends of the variable resistor by the write driver, however, in a column-direction write operation, a voltage may be applied to the bit line 123 by a bit line voltage driver 910, and a voltage may be applied to the column source line 122 by a column source line voltage driver 920.

When VDD/2 is applied to the bit line 123 and VDD is applied to the column source line 122, the voltage of VDD/2 may be applied to both ends of the variable resistor 113A. When 0 is applied to the column source line 940, the voltage of VDD/2 may be applied to both ends of the variable resistor 113B. Because opposite voltages are respectively applied to the variable resistor 113A and the variable resistor 113B, an operation of writing a logic value 0 or 1 by opposite write currents may be performed.

In a column-direction write operation, like the column-direction read operation, the plurality of memory cells selected by the column word line WL_COL0 and including the memory cell 110 may be connected to the same bit line 123. Accordingly, a voltage applied to the bit line 123 may also be applied to one ends of the plurality of variable resistors 113A and 113B.

For example, when 0, instead of VDD/2, is applied to the bit line 123 in FIG. 9, VDD may be applied to both ends of the variable resistor 113A to write a logic value 0 in the variable resistor 113A. However, because no voltage is applied to both ends of the variable resistor 113B, a logic value 1 may not be written in the variable resistor 113B. Because a voltage of the single bit line 123 is applied to one ends of the plurality of variable resistors 113A and 113B, VDD/2, instead of 0 or VDD, may be applied to the bit line 123.

In a write operation, unlike a read operation, the magnetization direction of the free layer included in the MTJ device may need to change, and accordingly, a write current may be required to have an intensity of a predetermined level or higher. In a column-direction write operation, because VDD/2, instead of VDD, is applied to the plurality of variable resistors 113A and 113B, a method for increasing intensities of write currents may be required.

In the case of a NMOS or PMOS transistor, a drain current in a saturation region may be in inverse proportion to the length of the gate, and in proportion to the width of the gate. In a semiconductor process, a gate length of a NMOS or PMOS transistor may be fixed to 9 nm, 14 nm, etc., and accordingly, by increasing the width of the gate, it may be possible to increase the intensity of a drain current. Accordingly, to increase the intensity of a write current, the gate of a column transistor may be designed to have a greater width than the gate of a row transistor.

Also, a negative voltage may be applied to either one or both of the column source line 122 and the bit line 123. For example, when −VDD is applied to the column source line 122, 0 may be applied to the bit line 123, and accordingly, an intensity of a voltage that is applied to both ends of the plurality of variable resistors 113A and 113B may become VDD, thereby increasing an intensity of a write current. A negative voltage converter, etc. may be used to generate a negative voltage.

A column-direction write operation may be performed on all or a part of memory cells selected by an arbitrary column word line. For example, a plurality of column source line drivers 920 and 930 for applying a voltage to the plurality of column source lines 122 and 940 may operate individually. Accordingly, a column-direction write operation may be performed on at least a part of memory cells selected by an arbitrary column word line.

Figure 10:
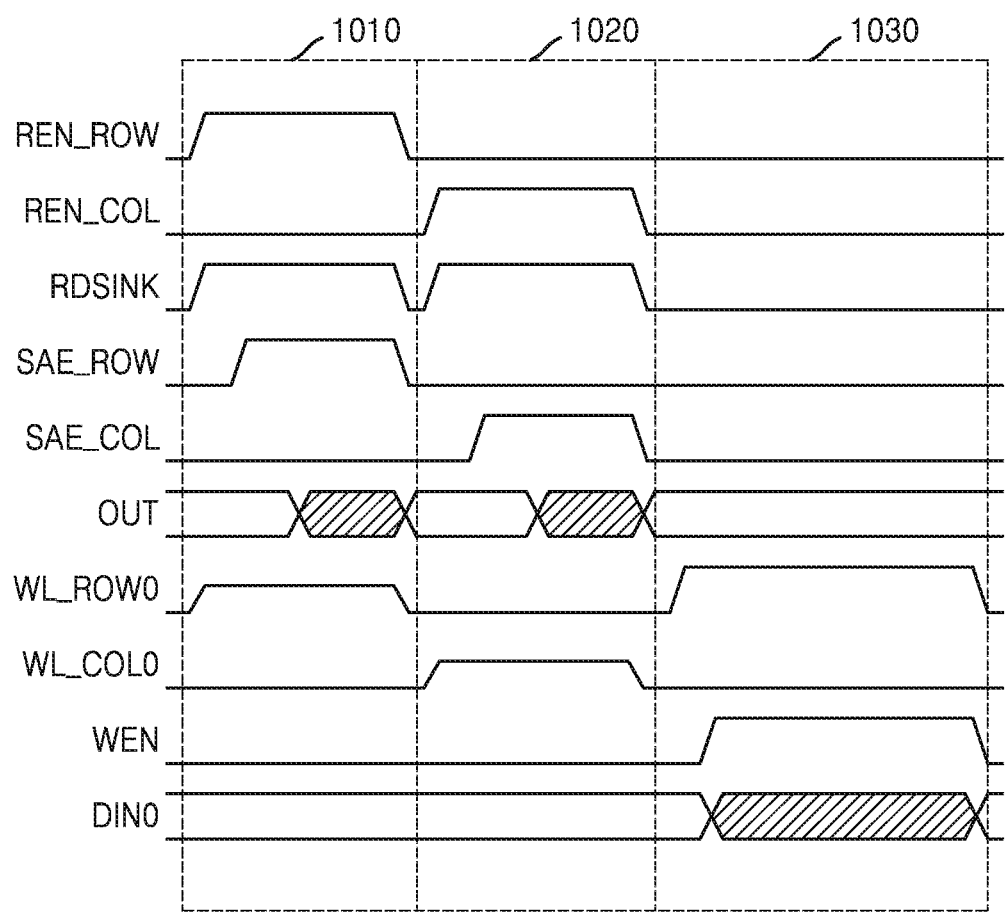
FIG. 10 is a diagram of operation waveforms of a resistive memory device, according to an embodiment.

FIG. 10 is a diagram of operation waveforms of a resistive memory device, according to an embodiment.

In FIG. 10, a process in which the resistive memory device 100 performs read and write operations is shown together with operation waveforms of signals REN_ROW, REN_COL, RDSINK, SAE_ROW, SAE_COL, WL_ROW0, WL_COL0, WEN, and DIN0 received by the read/write circuit 130.

In the case of a column-direction read operation 1010, when the row read enable signal REN_ROW and the read ground signal RDSINK are applied, the memory cell 110 may be connected to the row sense amplifier 131 and the ground 134. When VDD/2 is applied to the row word line WL_ROW0, the row transistor 111A may be shorted to form a path along which a read current may flow. When the row sense amplifier enable signal SAE_ROW is applied, a voltage corresponding to a logic value stored in the variable resistor 113A may be output through the output terminal OUT of the row sense amplifier 131.

A column-direction read operation 1020 may be performed in the same manner as the row-direction read operation 1010.

In the case of a row-direction write operation 1030, when VDD is applied to the row word line WL_ROW0, the row transistor 111A may be shorted, and the write driver 133 may be connected to the memory cell 110 through the row source line 121. When the write enable signal WEN is applied, a logic value corresponding to a voltage applied to the input data DIN0 may be written in the variable resistor 113A.

Referring to an operation waveform of the row word line WL_ROW0, in the case of the row-direction read operation 1010, an intensity of a voltage applied to the row word line WL_ROW0 is VDD/2, and in the case of the row-direction write operation 1030, an intensity of a voltage applied to the row word line WL_ROW0 is VDD. By applying a smaller intensity of a voltage to a word line during a read operation than that applied to the word line during a write operation, it may be possible to reduce consumption power and to secure data integrity.

When an intensity of a voltage applied to the gate terminal of a transistor decreases, an intensity of a current flowing between the source terminal and the drain terminal may also decrease, resulting in a decrease of power consumed by the transistor. In a read operation, unlike a write operation, VDD/2, instead of VDD, may be applied to a word line, and accordingly, the read operation may be normally performed even when an intensity of a read current decreases. Accordingly, in the read operations 1010 and 1020, VDD/2 may be applied to the word lines WL_ROW0 and WL_COL0, so that power consumed by the resistive memory device 100 may be reduced.

When an intensity of a read current flowing to the MTJ device during a read operation reaches a predetermined level or higher, data stored in the MTJ device may change unintentionally. Accordingly, it may be necessary to reduce the intensity of the read current to prevent the data from being damaged. In the read operations 1010 and 1020, because VDD/2 is applied to the word lines WL_ROW0 and WL_COL0 to decrease an intensity of a read current, it may be possible to prevent data from changing unintentionally.

In the resistive memory device 100 according to the disclosure, VDD/2 is used as an example. That is, another value that is greater than 0 and smaller than VDD may be used.

FIG. 11 is a circuit diagram of a resistive memory device according to another embodiment.

In FIG. 11, a resistive memory device 1100 including a memory cell 1110 having a structure that is different from that of the memory cell 110 shown in FIG. 2 is shown. The memory cell 1110, which is a 2T-1 R structure, may include the same components as those included in the memory cell 110 of FIG. 2. However, the resistive memory device 1100 of FIG. 11 may be different from the resistive memory device 100 of FIG. 2 in that a bit line 1120 is disposed in the row direction, not in the column direction, and a write driver 1150 is connected to a column source line 1140, not to a row source line 1130.

In the resistive memory device 1100, memory cells selected by a row word line WL_ROW0 may share the bit line 1120. Accordingly, in the resistive memory device 1100, characteristics according to sharing of a bit line may appear in row-direction read and write operations. For example, the gates of row transistors may be designed to have wider widths than those of the gates of column transistors, and a negative voltage may be applied to row source lines.

It will be easily understood by those of ordinary skill in the art that the above descriptions about the resistive memory device 100 shown in FIG. 2 may be applied to the resistive memory device 1100 shown in FIG. 11, except for a direction in which a plurality of bit lines including the bit line 1120 are arranged and a direction in which the characteristics according to the sharing of the bit line appear.

Figure 12:
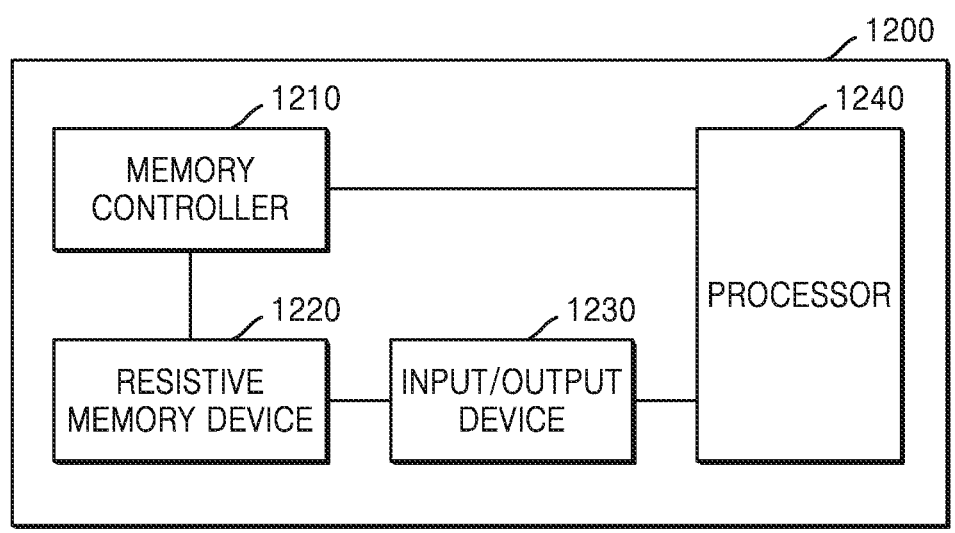
FIG. 12 is a block diagram of a configuration of a system including a resistive memory device, according to an embodiment.

FIG. 12 is a block diagram of a configuration of a system including a resistive memory device, according to an embodiment.

Referring to FIG. 12, system 1200 including a resistive memory device may include a memory controller 1210, a resistive memory device 1220, an input/output device 1230, and a processor 1240. In the system 1200 shown in FIG. 12, only components related to the current embodiment are shown. Therefore, it will be understood by those of ordinary skill in the art that other general-purpose components except for the components shown in FIG. 12 may be further included in the system 1200.

The memory controller 1210 may be connected to the resistive memory device 1220, and configured to apply a word line voltage and various control signals to the resistive memory device 1220.

The resistive memory device 1220 may correspond to the resistive memory device 100 of FIG. 1 or the resistive memory device 1100 of FIG. 11. Accordingly, the above description about the resistive memory device 100 of FIG. 1 or the resistive memory device 1100 of FIG. 11 will be applied in the same manner to the resistive memory device 1220 of FIG. 12, and accordingly, detailed descriptions thereof will be omitted. For example, the read and write operations that are performed by the resistive memory device 100 of FIG. 1 or the resistive memory device 1100 of FIG. 11 may also be performed by the resistive memory device 1220.

The input/output device 1230 may transfer a control signal transmitted from the processor 1240 to the resistive memory device 1220, and data transmitted from the resistive memory device 1220 to the processor 1240.

The processor 1240 may transmit the control signal to the memory controller 1210 and the input/output device 1230, and perform read and write operations on the resistive memory device 1220 based on the control signal.

The processor 1240 may be implemented as one or a plurality of processors. For example, the processor 1240 may be implemented as an array of a plurality of logic gates, or as a combination of memories storing a program that may be executed by a general-purpose microprocessor and a microprocessor. Also, the processor 1240 may be configured with a plurality of processing elements.

The system 1200 including the resistive memory device 1220 may be system having bi-directional access to data. For example, the system 1200 may be neuromophic system performing reading or writing of a large amount of data, high-definition image processing system, etc.

For example, when the system 1200 including the resistive memory device 1220 is neuromophic system, the system 1200 may imitate a biological neural network structure using hardware to mimick a human's brain. The resistive memory device 1220 may be a synapse circuit, and the input/output device 1230 may be a pre-synaptic neuron and a post-synaptic neuron.

The system 1200 may perform learning using an algorithm using a bi-directional neural network. For example, the system 1200 may perform deep learning using a Restricted Boltzmann Machine (RBM) method.

The memory controller 1210, the resistive memory device 1220, the input/output device 1230, and the processor 1240 constituting the system 1200 may be implemented as a single chip. System On Chip (SOC) in which all of learning and inference are performed by the system 1200 on one chip may be implemented. Also, as the system 1200 mounted on the chip performs learning using an algorithm using a bi-directional neural network, on-chip learning may be implemented.

Because the resistive memory device 1220 performs transposable read and write operations, read and write operations performed by the resistive memory device 1220 may achieve high efficiency in view of operation speed and consumption power. Also, because the system 1200 adopts the resistive memory device 1220 having high efficiency, neuromophic system performing read and write operations on a large amount of data may be implemented.

However, the neuromophic system according to the current embodiment is only an example of the system 1200, and the system 1200 is not limited thereto. The system 1200 may be another system having bi-directional access to data.

As is traditional in the field of the inventive concepts, the example embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the example embodiments may be physically separated into two or more interacting and discrete blocks, units and/or modules without departing from the scope of the inventive concepts. Further, the blocks, units and/or modules of the example embodiments may be physically combined into more complex blocks, units and/or modules without departing from the scope of the inventive concepts.

While one or more embodiments have been described with reference to the figures, it will be understood by those of ordinary skill in the art that various changes in form and details may be made therein without departing from the spirit and scope as defined by the following claims.

What is claimed is:

1. A resistive memory device comprising:
   a memory cell array in which a plurality of memory cells are arranged in a matrix,
   wherein each of the plurality of memory cells comprises:
      a variable resistor comprising a first end connected to a bit line, and a second end;
      a row transistor connected between a row source line and the second end of the variable resistor, wherein the row transistor is selectable by a row word line; and
      a column transistor connected between a column source line and the second end of the variable resistor, wherein the column transistor is selectable by a column word line,
   wherein, based on the row transistor being selected, first data is written or second data is read in a row direction of the memory cell array, and
   wherein, based on the column transistor being selected, the first data is written or the second data is read in a column direction of the memory cell array.

2. The resistive memory device of claim 1, further comprising a row sense amplifier connected to the row source line,
   wherein, based on the row transistor being selected by the row word line, a logic value that is stored in the variable resistor is identified using the row sense amplifier.

3. The resistive memory device of claim 1, wherein the second data is read in the row direction of any one or any combination of first memory cells that are arranged along the row word line and connected to the row word line, among the plurality of memory cells.

4. The resistive memory device of claim 1, further comprising a column sense amplifier connected to the column source line, wherein, based on the column transistor being selected by the column word line, a logic value that is stored in the variable resistor is identified using the column sense amplifier.

5. The resistive memory device of claim 1, wherein the second data is read in the column direction of any one or any combination of second memory cells that are arranged along the column word line and connected to the column word line, among the plurality of memory cells.

6. The resistive memory device of claim 1, further comprising a write driver connected between the row source line and the bit line,
wherein, based on the row transistor being selected by the row word line, a logic value that is stored in the variable resistor is changed or maintained, based on a voltage applied to the row source line and the bit line by the write driver.

7. The resistive memory device of claim 1, wherein, based on the column transistor being selected by the column word line, a logic value that is stored in the variable resistor is changed or maintained, based on a voltage applied to the column source line and the bit line.

8. The resistive memory device of claim 1, wherein a first gate of the column transistor has a first width greater than a second width of a second gate of the row transistor, and
a negative voltage is applied to either one or both of the first end and the second end of the variable resistor.

9. The resistive memory device of claim 1, wherein the resistive memory device is any one or any combination of ferroelectric random access memory (FRAM), magnetoresistive random access memory (MRAM), nano-floating gate memory (NFGM), phase-change random access memory (PRAM), resistive random access memory (RRAM), static random access memory (SRAM), and flash memory.

10. The resistive memory device of claim 1, wherein the variable resistor stores at least one logic value, wherein each of the at least one logic value corresponds to a bit.

11. A system comprising:
a resistive memory device comprising a memory cell array in which a plurality of memory cells are arranged in a matrix;
a memory controller configured to control the resistive memory device;
an input/output device configured to receive first data to be written to the resistive memory device, and output second data that is read from the resistive memory device; and
a processor configured to control the memory controller and the input/output device,
wherein each of the plurality of memory cells comprises:
a variable resistor comprising a first end connected to a bit line, and a second end;
a row transistor connected between a row source line and the second end of the variable resistor, wherein the row transistor is selectable by a row word line; and
a column transistor connected between a column source line and the second end of the variable resistor, wherein the column transistor is selectable by a column word line,
wherein, based on the row transistor being selected, the first data is written or the second is read in a row direction of the memory cell array, and
wherein, based on the column transistor being selected, the first data is written or the second data is read in a column direction of the memory cell array.

12. The system of claim 11, wherein the resistive memory device further comprises a row sense amplifier connected to the row source line,
wherein, based on the row transistor being selected by the row word line, a logic value that is stored in the variable resistor is identified using the row sense amplifier.

13. The system of claim 11, wherein the second data is read in the row direction of any one or any combination of first memory cells that are arranged along the row word line and connected to the row word line, among the plurality of memory cells.

14. The system of claim 11, wherein the resistive memory device further comprises a column sense amplifier connected to the column source line,
wherein, based on the column transistor being selected by the column word line, a logic value that is stored in the variable resistor is identified using the column sense amplifier.

15. The system of claim 11, wherein the second data is read in the column direction of any one or any combination of second memory cells that are arranged along the column word line and connected to the column word line, among the plurality of memory cells.

16. The system of claim 11, wherein the resistive memory device further comprises a write driver connected between the row source line and the bit line,
wherein, based on the row transistor being selected by the row word line a logic value that is stored in the variable resistor is changed or maintained, based on a voltage applied to the row source line and the bit line by the write driver.

17. The system of claim 11, wherein, based on the column transistor being selected by the column word line, a logic value that is stored in the variable resistor is changed or maintained, based on a voltage applied to the column source line and the bit line.

18. The system of claim 11, wherein a first gate of the column transistor has a first width greater than a second width of a second gate of the row transistor, and
a negative voltage is applied to either one or both of the first end and the second end of the variable resistor.

19. The system of claim 11, wherein the resistive memory device is any one or any combination of ferroelectric random access memory (FRAM), magnetoresistive random access memory (MRAM), nano-floating gate memory (NFGM), phase-change random access memory (PRAM), resistive random access memory (RRAM), static random access memory (SRAM), and flash memory.

20. The system of claim 11, wherein the variable resistor stores at least one logic value, wherein each of the at least one logic value corresponds to a bit.

* * * * *